(12) United States Patent
Jang et al.

(10) Patent No.: US 9,105,607 B2
(45) Date of Patent: Aug. 11, 2015

(54) SEMICONDUCTOR DEVICE

(71) Applicant: SAMSUNG ELECTRONICS Co., Ltd., Suwon-si (KR)

(72) Inventors: Jaejune Jang, Hwaseong-si (KR); JaeHyun Jung, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/212,663

(22) Filed: Mar. 14, 2014

(65) Prior Publication Data

US 2014/0264622 A1 Sep. 18, 2014

(30) Foreign Application Priority Data

Mar. 15, 2013 (KR) ........................ 10-2013-0028147

(51) Int. Cl.

| | |
|---|---|
| *H01L 29/423* | (2006.01) |
| *H01L 27/092* | (2006.01) |
| *H01L 29/78* | (2006.01) |
| *H01L 29/04* | (2006.01) |
| *H01L 29/06* | (2006.01) |
| *H01L 21/8238* | (2006.01) |
| *H01L 27/02* | (2006.01) |
| *H01L 29/165* | (2006.01) |

(52) U.S. Cl.
CPC .... *H01L 29/4238* (2013.01); *H01L 21/823807* (2013.01); *H01L 27/0207* (2013.01); *H01L 27/092* (2013.01); *H01L 29/045* (2013.01); *H01L 29/0653* (2013.01); *H01L 29/78* (2013.01); *H01L 29/7833* (2013.01); *H01L 29/7842* (2013.01); *H01L 29/165* (2013.01)

(58) Field of Classification Search
CPC ............ H01L 29/4238; H01L 29/7842; H01L 29/045; H01L 28/7833; H01L 29/0653; H01L 27/092; H01L 29/78; H01L 29/165
See application file for complete search history.

(56) References Cited

U.S. PATENT DOCUMENTS

| | | | |
|---|---|---|---|
| 5,355,008 A | 10/1994 | Moyer et al. | |
| 5,447,876 A | 9/1995 | Moyer et al. | |
| 6,084,266 A | 7/2000 | Jan | |
| 6,713,823 B1 * | 3/2004 | Nickel | 257/401 |
| 6,867,460 B1 * | 3/2005 | Anderson et al. | 257/351 |

(Continued)

FOREIGN PATENT DOCUMENTS

| | | |
|---|---|---|
| JP | 05-013759 | 1/1993 |
| JP | 11-261056 | 9/1999 |

OTHER PUBLICATIONS

Kuroda et al., "Impact of Channel Direction Dependent Low Field Hole Mobility on (100) Orientation Silicon Surface." Japanese Journal of Applied Physics 50, 2011.

(Continued)

*Primary Examiner* — William Coleman
(74) *Attorney, Agent, or Firm* — Muir Patent Law, PLLC

(57) ABSTRACT

A semiconductor device includes a semiconductor substrate of a first conductivity type, a mesh-type gate electrode including first portions extending in a first direction and second portions extending in a second direction crossing the first direction over the substrate. The mesh-type gate structure may have a plurality of openings, and source regions and drain regions of second conductivity type alternately arranged in the first direction and the second direction in the substrate at locations corresponding to the openings.

35 Claims, 20 Drawing Sheets

(56) References Cited

U.S. PATENT DOCUMENTS

| | | |
|---|---|---|
| 7,078,775 B2 | 7/2006 | Yi et al. |
| 7,126,187 B2 * | 10/2006 | Aoki et al. .................... 257/330 |
| 7,294,892 B2 | 11/2007 | Chen |
| 7,723,804 B2 | 5/2010 | Ajiki |
| 7,863,657 B2 | 1/2011 | Sutardja |
| 7,888,710 B2 | 2/2011 | Armstrong et al. |
| 8,008,751 B2 | 8/2011 | Irisawa et al. |
| 2007/0295996 A1 * | 12/2007 | Mallikararjunaswamy .. 257/204 |
| 2008/0303090 A1 * | 12/2008 | Ieong et al. .................. 257/351 |
| 2009/0072314 A1 | 3/2009 | Okumura et al. |
| 2009/0079007 A1 | 3/2009 | Yamaguchi et al. |
| 2011/0115029 A1 | 5/2011 | Van Den Boom |
| 2011/0186935 A1 | 8/2011 | Ueda et al. |
| 2013/0248988 A1 * | 9/2013 | Ono et al. ..................... 257/330 |

OTHER PUBLICATIONS

Drennan et al., "Implications of Proximity Effects for Analog Design." IEEE 2006 Custom Integrated Circuits Conference (CICC), 2006.

* cited by examiner

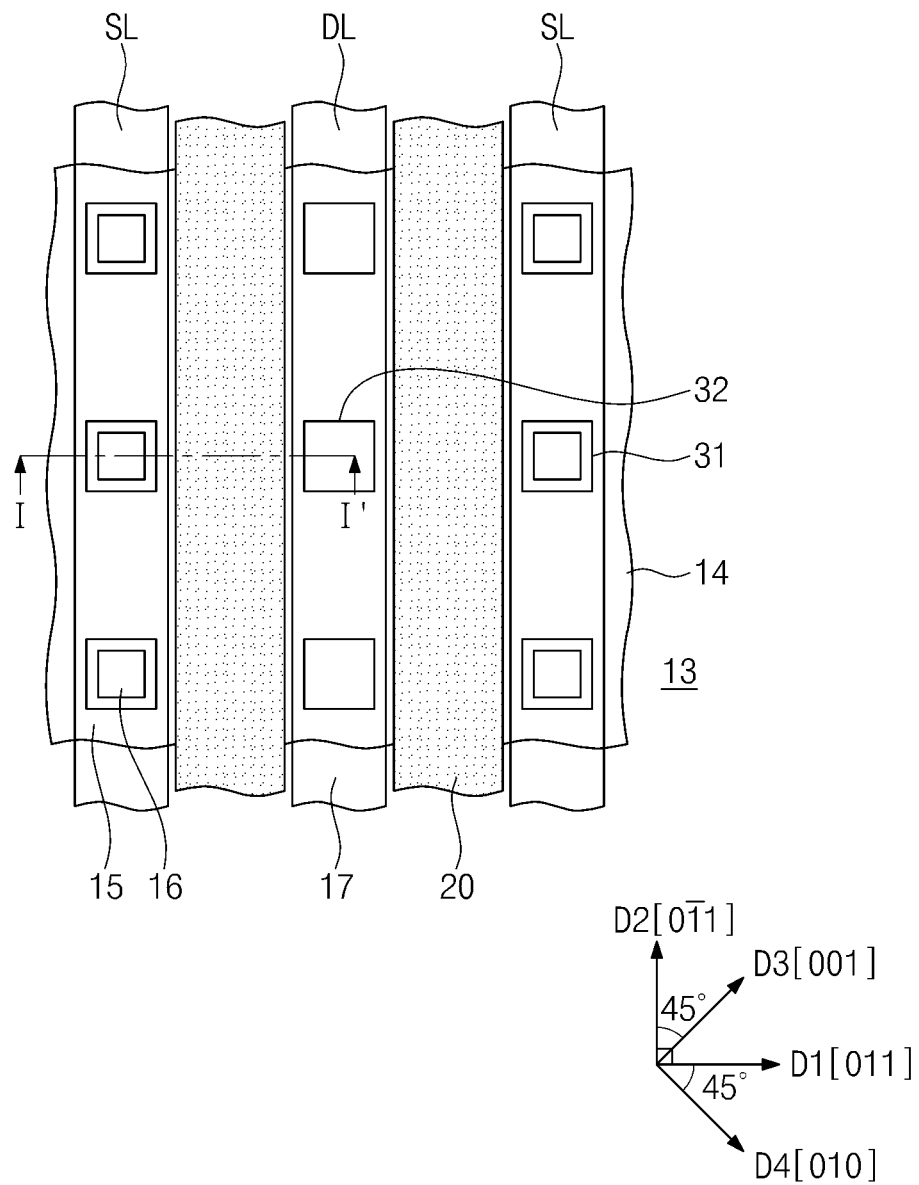

SEMICONDUCTOR DEVICE

CROSS-REFERENCE TO RELATED APPLICATIONS

This US non-provisional patent application claims priority under 35 USC §119 to Korean Patent Application No. 10-2013-0028147, filed on Mar. 15, 2013, the entirety of which is hereby incorporated by reference.

BACKGROUND OF THE INVENTION

Exemplary embodiments of inventive concepts relate to semiconductor devices.

In semiconductor devices, there is an increasing demand for low voltage power devices, such as complementary metal-oxide-semiconductor (CMOS) devices.

SUMMARY OF THE INVENTION

In an exemplary embodiment, a semiconductor device may comprise a silicon substrate of a first conductivity type; a mesh-type gate electrode on the silicon substrate, including first portions extending in a first direction and second portions extending in a second direction orthogonal to the first direction, and having a plurality of openings; and source regions and drain regions of a second conductivity type arranged in the silicon substrate at locations exposed by the openings, the source regions and drain regions being alternately arranged in the first direction and alternately arranged in the second direction.

The first direction may be a <100> silicon crystal direction of the silicon substrate.

According to some embodiments, a semiconductor device may comprise a silicon substrate of a first conductivity type; a mesh-type gate electrode on the silicon substrate, including first portions extending in a first direction and second portions extending in a second direction orthogonal to the first direction, and having a plurality of openings; and source regions and drain regions of a second conductivity type in the silicon substrate at locations under the openings, the source regions and drain regions being alternately arranged in the first direction and alternately arranged in the second direction; and embedded regions embedded in the silicon substrate located under intersections of the first portions and the second portions.

A semiconductor device according to disclosed embodiments may comprise a silicon substrate including a PMOS region and an NMOS region; a PMOS transistor in the PMOS region, including a mesh-type first gate electrode including first portions extending in a first direction and second portions extending in a second direction crossing the first direction and having a plurality of first openings and P-type source and drain regions provided at locations under the first openings; an NMOS transistor in the NMOS region, including a mesh-type second gate electrode including third portions extending in a third direction that is at an angle of 45 degrees from the first direction and second portions extending in a fourth direction orthogonal to the third direction and having a plurality of second openings and N-type source and drain regions provided at locations under the second openings; and first embedded regions disposed in the silicon substrate under respective intersection regions of the first portions and the second portions.

According to some embodiments, a semiconductor device may comprise a crystalline semiconductor substrate; a device isolation insulator embedded within the semiconductor substrate and defining a first active region; and a PMOS transistor comprising: a first gate electrode having a mesh structure formed over the first active region; and a plurality of first source regions and first drain regions formed in the first active region at locations under openings of the mesh structure of the first gate electrode, wherein a plurality of first channel regions are formed in the first active region at locations between neighboring first source regions and first drain regions, at least some of the first channel regions having a channel length extending in a first direction, wherein the first direction is a <100> crystal direction of the crystalline semiconductor substrate.

Some of the first source regions may have plural neighboring first drain regions with plural corresponding first channel regions disposed therebetween under the mesh structure of the first gate electrode.

Semiconductor devices described herein may be used in low voltage power devices, such as in implementing complementary metal-oxide-semiconductor (CMOS) devices.

BRIEF DESCRIPTION OF THE DRAWINGS

Inventive concepts will become more apparent in view of the attached drawings and accompanying detailed description. The embodiments depicted therein are provided by way of example, not by way of limitation, wherein like reference numerals refer to the same or similar elements. The drawings are not necessarily to scale.

FIG. 1A illustrates an example of a typical semiconductor device.

DETAILED DESCRIPTION

Figure 1B:
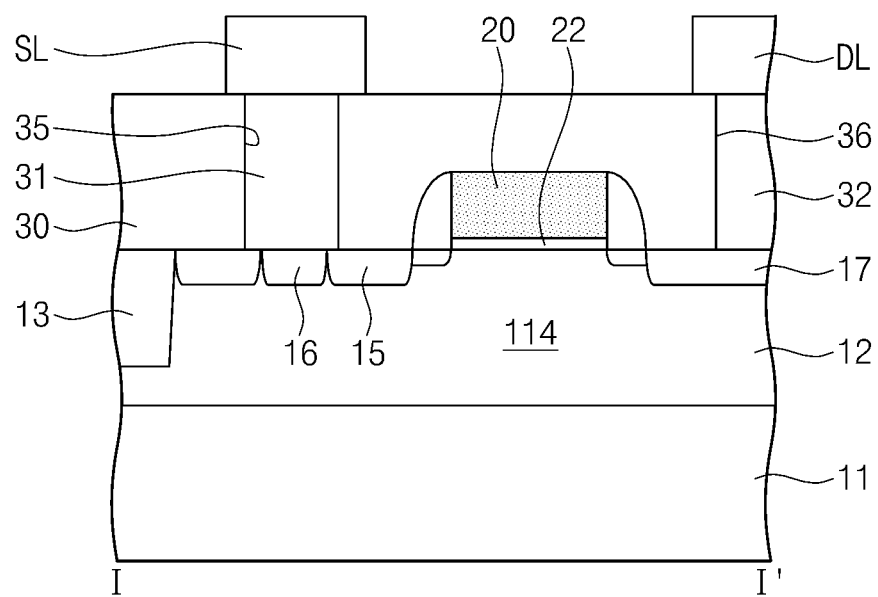
FIG. 1B is a cross-sectional view taken along the line I-I' in FIG. 1A.

The advantages and features of the inventive concept and methods of achieving them will be apparent from the following exemplary embodiments that will be described in more detail with reference to the accompanying drawings. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the specification, it will be understood that when an element is referred to as being "on" another layer or substrate, it can be directly on the other element, or intervening elements may also be present. In the drawings, sizes, such as thicknesses of elements, and relative sizes may be exaggerated for clarity of illustration.

Exemplary embodiments of the invention will be described below with reference to cross-sectional views, which are exemplary drawings of the invention. The exemplary drawings may be modified by manufacturing techniques and/or tolerances. Accordingly, the exemplary embodiments of the invention are not limited to specific configurations shown in the drawings, and include modifications based on the method of manufacturing the semiconductor device. For example, an etched region shown at a right angle may be formed in a rounded shape or formed to have a predetermined curvature. Therefore, regions shown in the drawings may have schematic characteristics. In addition, the shapes of the regions shown in the drawings may exemplify specific shapes of regions in an element, and do not limit the invention.

Though terms like a first, a second, and a third are used to describe various elements in various embodiments of the inventive concept, the elements are not limited to these terms. These terms are used only to differentiate one element from another element. An embodiment described and exemplified herein includes a complementary embodiment thereof.

The terms used in the specification are for the purpose of describing particular embodiments only and are not intended to be limiting of the invention. As used in the specification, the singular forms "a", "an" and "the" are intended to include the plural forms as well, unless the context clearly indicates otherwise. It will be further understood that the terms "comprises" and/or "comprising", when used in the specification, specify the presence of stated features, integers, steps, operations, elements, and/or components, but do not preclude the presence or addition of one or more other features, integers, steps, operations, elements, components, and/or groups thereof.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Hereinafter, embodiments of the inventive concept will now be described more fully with reference to accompanying drawings.

In one example, a semiconductor device may include a silicon substrate whose top surface is a (100) surface. In general, electron mobility is higher in the <110> direction than in the <100> direction. On the other hand, hole mobility is higher in the <100> direction than in the <110> direction. This is because the effective mass of holes is smaller in the <100> direction than in the <110> direction. In the detailed description of this application, a first direction D1 is a [011] direction, a second direction D2 is orthogonal to the first direction D1 (i.e., D2 is a [0-11] direction), a third direction D3 is at an angle of 45 degrees to the first direction D1, here 45 degrees counterclockwise with respect to the top surface of silicon substrate (i.e., D3 is a [001] direction), and a fourth direction D4 is orthogonal to the third direction D3 (i.e., D4 is the [010] direction). As will be understood, the third direction D3 [001] is a <100> direction in a silicon crystal. Although the embodiments of the invention are described with respect to these directions, and these directions with respect to these embodiments refer to a particular crystalline orientation, the invention and directions are not limited thereto unless otherwise specified in the claims.

FIG. 1A illustrates features of a typical semiconductor device 10, and FIG. 1B is a cross-sectional view taken along the line I-I' in FIG. 1A. In the example of FIGS. 1A and 1B, the semiconductor device 10 includes a silicon substrate 11 whose top surface is in a (100) direction, a plurality of gate electrodes 20, source regions 15, and drain regions 17.

A well region 12 of first conductivity type may be provided with the silicon substrate 11. The first conductivity type may be N-type or P-type. For NMOS, the first conductivity type may be P-type. For PMOS, the first conductivity type may be N-type. A device isolation insulating layer 13 may be provided in the well region 12 to define an active region 14. The active region 14 may be surrounded by the device isolation insulating layer 13. The active region 14 in FIG. 1 may have a square shape but is not limited thereto.

Gate electrodes 20 may extend in the second direction D2. The gate electrodes 20 may be made of, for example, polysilicon of second conductivity type different from the first conductivity type. A gate insulating layer 22 may be provided between the silicon substrate 11 and the gate electrodes 20. The gate insulating layer 22 may be made of, for example, silicon oxide. In addition, an insulating spacer may be provided on the sidewall of the gate electrodes 20.

Source regions 15 and drain regions 17 are formed in the exposed silicon substrate 11 between the gate electrodes 20. The source regions 15 and the drain regions 17 may be alternately provided in the first direction D1. The source regions 15 and the drain regions 17 may have the second conductivity type. The ground contact regions 16 may have the first conductivity type. In addition, ground contact regions 16 may be provided in the silicon substrate 11 surrounded by the source regions 14. The ground contact regions 16 may have the first conductivity type.

An interlayer dielectric 30 may be provided on the silicon substrate 11. The interlayer dielectric 30 may include silicon oxide. First contact holes 35 and second contact holes 36 may be provided at the interlayer dielectric 30 to expose the source region 15 and the drain regions 17, respectively. The first contact holes 35 may be formed to expose the ground contact regions 16. First contacts 31 and second contacts 32 may be formed in the first contact holes 35 and the second contact holes 36, respectively. The first and second contacts 31 and 32 may include titanium, titanium nitride, and/or tungsten.

Source interconnections SL and drain interconnections DL may be provided on the interlayer dielectric 30. The source interconnections SL may be provided to electrically connect the source regions 15 arranged in the second direction D2. The source interconnections SL and the source regions 15 may be connected to each other through the first contacts 31. The first contacts 31 may be in contact with the ground contact regions 16. The drain interconnections DL may be provided to electrically connect the drain regions 17 arranged in the second direction D2. The drain interconnections DL and the drain regions 17 may be connected to each other through the second contacts 32. The drain interconnections DL may extend in the second direction D2. The source interconnections SL and the drain interconnections DL may be alternately arranged in the first direction D1.

Figure 2A:
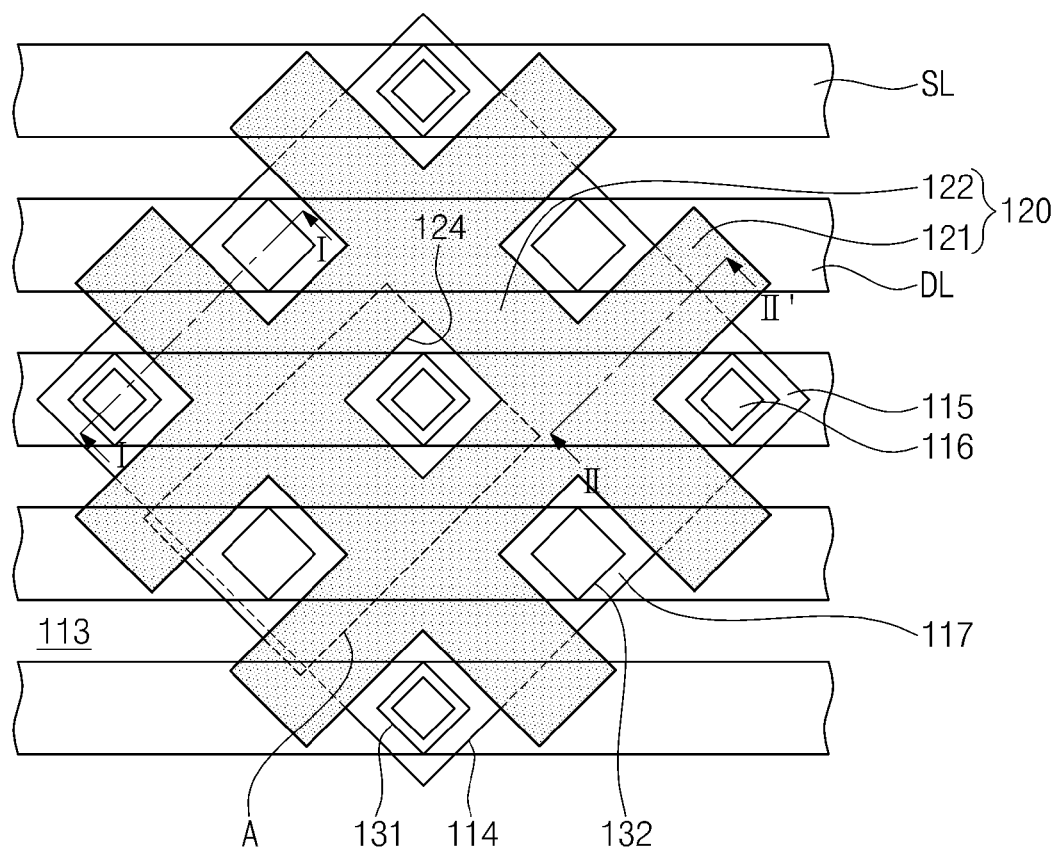
FIG. 2A illustrates a semiconductor device according to an embodiment of the inventive concept.
Figure 2A:
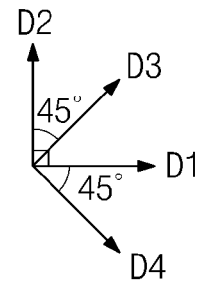
Figure 2B:
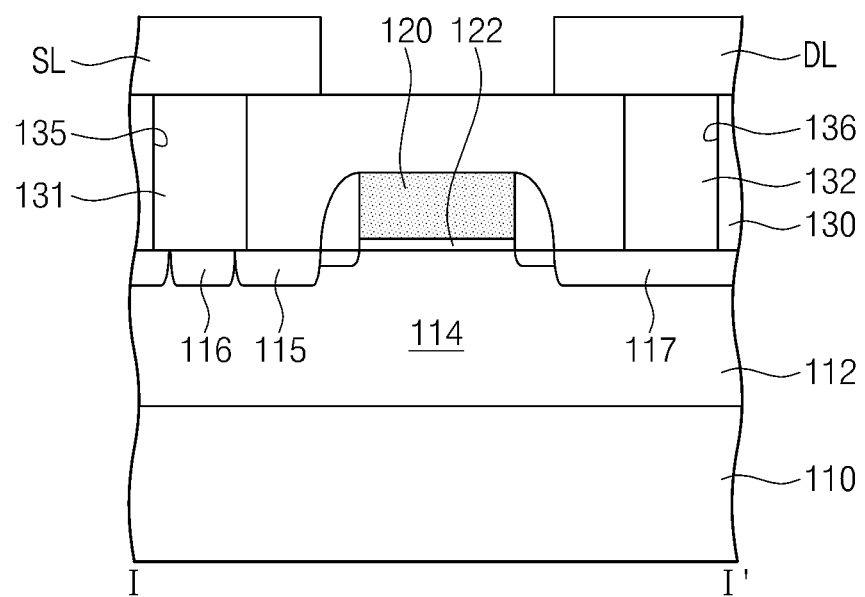
FIGS. 2B and 2C are cross-sectional views taken along the lines I-I' and II-II' in FIG. 2A, respectively.
Figure 2C:
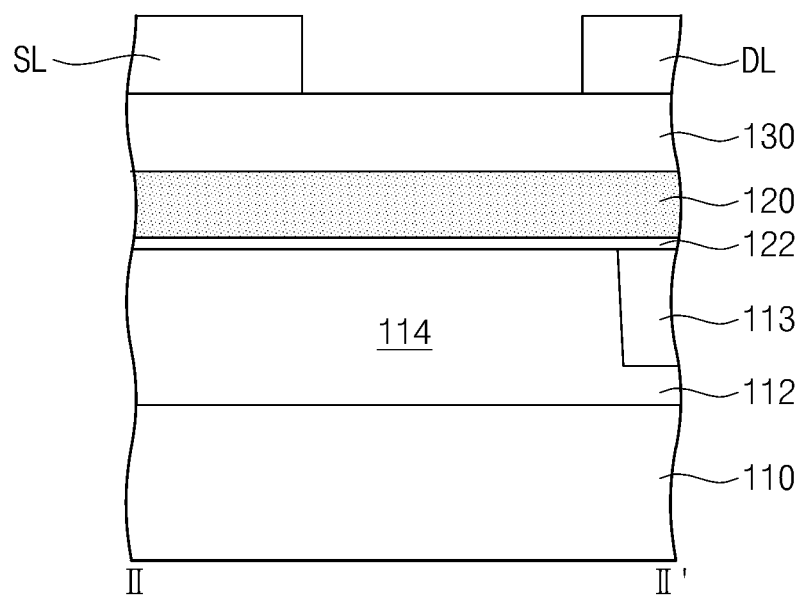

FIG. 2A illustrates a semiconductor device 100 according to an embodiment of the inventive concept. FIGS. 2B and 2C are cross-sectional views taken along the lines I-I' and II-II' in FIG. 2A, respectively.

Referring to FIGS. 2A to 2C, the semiconductor device 100 may include a silicon substrate 110 whose top surface is in a (100) direction, a gate electrode 120, source regions 115, and drain regions 117.

A well region 112 of the first conductivity type may be provided in the silicon substrate 110. The first conductivity type may be N-type or P-type. For NMOS, the first conductivity type may be P-type. For PMOS, the first conductivity type may be N-type. A device isolation insulating layer 113 may be provided in the well region 112 to define an active region 114. The well region 112 may be surrounded by the device isolation insulating layer 113. The well region 112 in FIG. 2A may have a diamond shape but is not limited thereto.

The gate electrode 120 has first portions 121 extending in the third direction D3 and second portions 122 extending in the fourth direction D4. Accordingly, the gate electrode 120 may be a mesh (or grid) type electrode having a plurality of openings 124. The openings 124 may be formed to expose the silicon substrate 110. The gate electrode 120 may be made of, for example, polysilicon of the second conductivity type. A gate insulating layer 122 may be provided between the silicon substrate 110 and the gate electrode 120. In addition, an insulating spacer may be provided on the sidewall of the gate electrode 120.

Source regions 115 and drain regions 117 may be formed in the silicon substrate 110 exposed by the openings 124. The source regions 115 and the drain regions 117 may have a shape of square. The source regions 115 and the drain regions 117 may be alternately provided in the third direction D3 and the fourth direction D4. In other words, the source regions 115 and the drain regions 117 may be alternately provided in a first direction D1 and a second direction D2. The source regions 115 and the drain regions 117 may have the second conductivity type. Ground contact regions 116 may be further provided in the silicon substrate 110 surrounded by the source regions 115. The ground contact regions 116 may have the first conductivity type.

An interlayer dielectric 130 may be provided on the silicon substrate 110. The interlayer dielectric 130 may include silicon oxide. First contact holes 135 and second contact holes 136 may be provided at the interlayer dielectric 130 to expose the source region 115 and the drain regions 117, respectively. The first contact holes 135 may be formed to expose the ground contact regions 116. First contacts 131 and second contacts 132 may be formed in the first contact holes 135 and the second contact holes 136, respectively. The first and second contacts 131 and 132 may include titanium, titanium nitride, and/or tungsten.

Source interconnections SL and drain interconnections DL may be provided on the interlayer dielectric 130. The source interconnections SL may be provided to electrically connect the source regions 115 arranged in the first direction D1. The source interconnections SL and the source regions 115 may be connected to each other through the first contacts 131. The first contacts 131 may be in contact with the ground contact regions 116. The source interconnections SL may extend in the first direction D1. The drain interconnections DL may be provided to electrically connect the drain regions 117 arranged in the first direction D1 (or the second direction D2). The drain interconnections DL and the drain regions 117 may be connected to each other through the second contacts 132. The drain interconnections DL may extend in the first direction D1. The source interconnections SL and the drain interconnections DL may be alternately arranged in the second direction 24. Although it is shown that the source interconnections SL and the drain interconnections DL extend in the first direction D1, they may be disposed to extend in the second direction D2.

Figure 3:
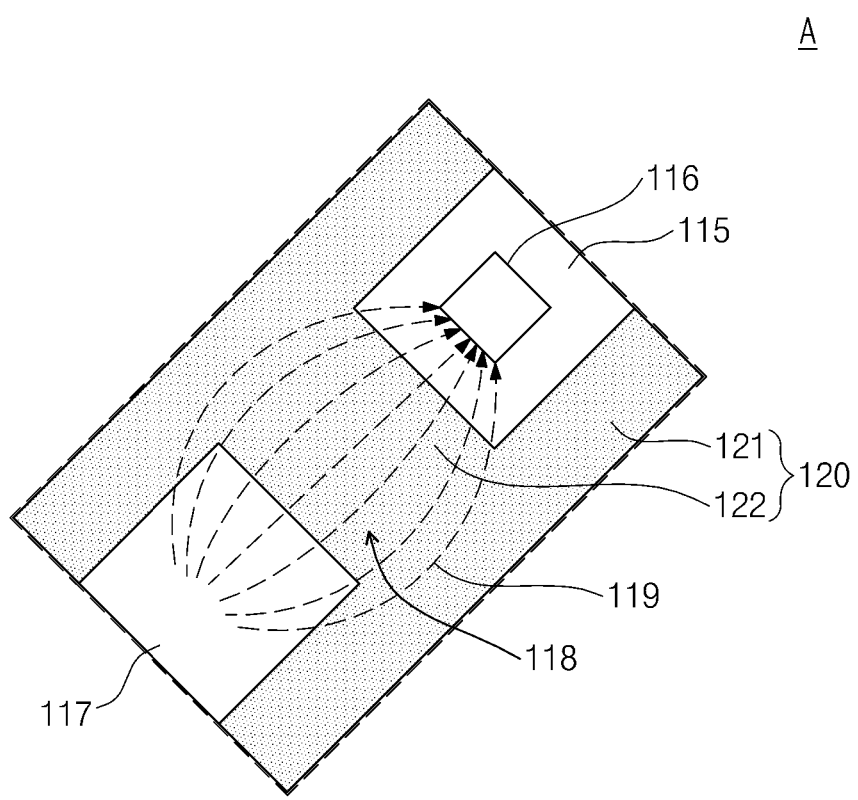
FIG. 3 is an enlarged view of a portion "A" in FIG. 2A.

FIG. 3 is an enlarged view of a portion "A" in FIG. 2A. Referring to FIGS. 2A and 3, channel regions 118 may be provided between the source regions 115 and the drain regions 117. The channel regions 118 may extend in the third direction D3 and the fourth direction D4. The channel regions 118 may extend to an overlap region of the first portions 121 and the second portions 122. Width of the channel regions 118 may increase to be about two times larger than that of the typical semiconductor device 10 described with reference to FIG. 1. Thus, current 119 flowing between the source regions 115 and the drain regions 117 may increase. Additionally, in this example, the channel includes a portion extending in the <100> direction (as well as a portion extending in the [010] direction).

According to this embodiment, current drivability may be improved as compared to the typical semiconductor device described with reference to FIG. 1. For example, saturated drain current (hereinafter referred to as "IDSAT") of PMOS may be improved by about 27 percent and IDSAT of NMOS may be improved by about 17 percent. Furthermore, since the gate electrode 120 has a mesh-type structure according to this embodiment, electrical resistance of the gate electrode 120 may be reduced. Thus, operating speed of a semiconductor device can be enhanced.

Figure 4A:
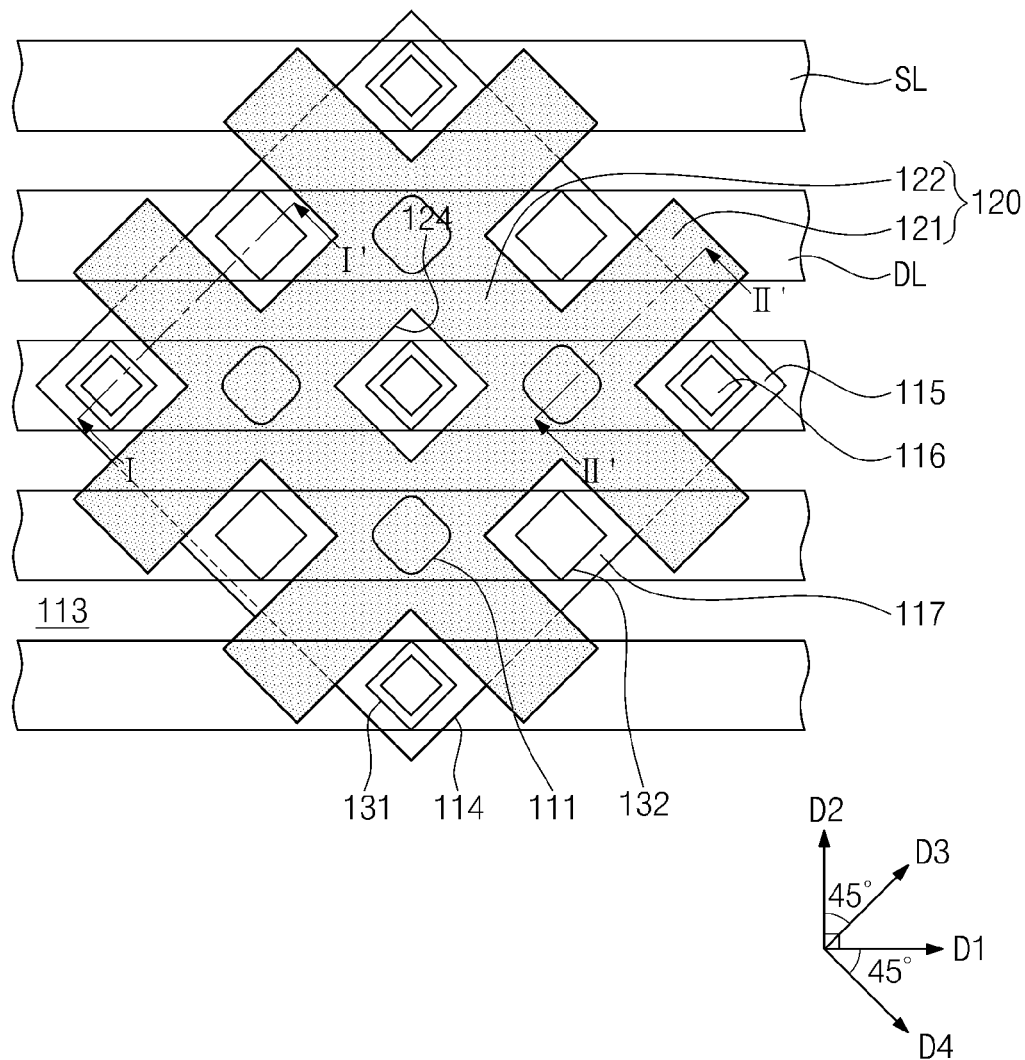
FIG. 4A illustrates a semiconductor device according to another embodiment of the inventive concept.
Figure 4B:
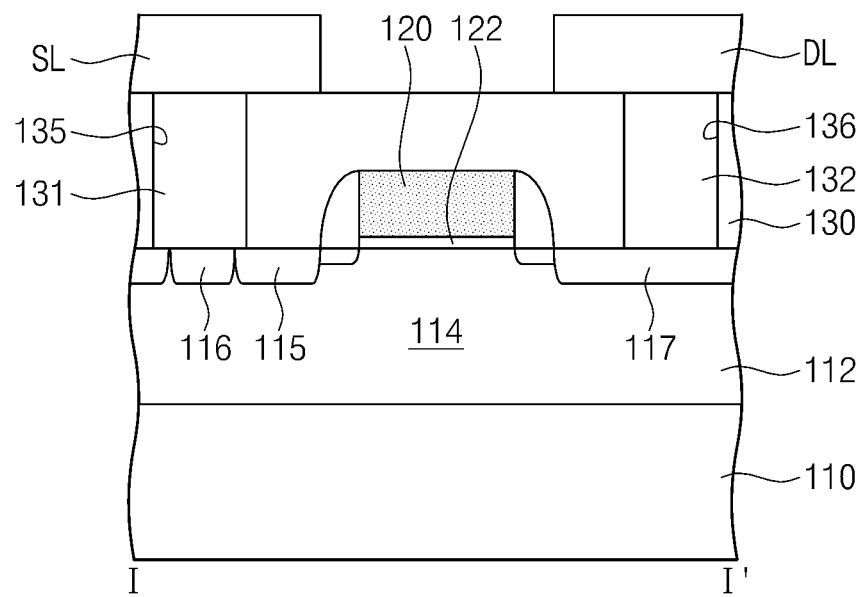
FIGS. 4B and 4C are cross-sectional views taken along the lines I-I' and II-II' in FIG. 4A, respectively.
Figure 4C:
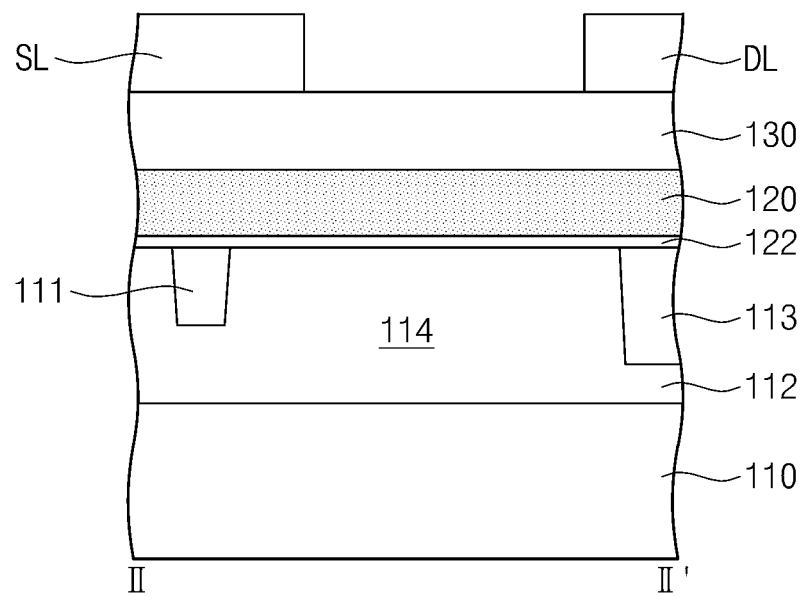

FIG. 4A illustrates a semiconductor device 200 according to another embodiment of the inventive concept. FIGS. 4B and 4C are cross-sectional views taken along the lines I-I' and II-II' in FIG. 4A, respectively. A semiconductor device according to another embodiment of the inventive concept will now be described. In FIGS. 4A to 4C, portions different from FIGS. 2A to 2C and FIG. 3 will be described to avoid duplicate explanation.

Referring to FIGS. 4A to 4C, the semiconductor device 200 may include buried regions 111 formed in a substrate 110, in an overlap region of first portions 121 and second portions 122. The buried regions 111 may be disposed in the shape of an island, in the center of two pairs of source regions 115 and drain regions 117 directly adjacent to each other. The buried regions 111 may be fully covered with the gate electrode 120. The buried regions 111 may apply a compressive stress to channel regions 118 in the third and fourth directions D3 and D4. The buried regions 111 may include, for example, a buried material filled in a trench. The buried material may include an insulator, germanium or silicon-germanium. The insulator may be, for example, silicon oxide. The buried regions 111 may have the same or smaller depth as or than the device isolation layer 113.

According to an embodiment, since the buried regions 111 induce compressive stress in the channel regions 117, current mobility of PMOS can be enhanced by about 4 percent (when the buried regions 111 include silicon oxide), as compared to the first embodiment described with reference to FIGS. 2A to 2C. Thus, according to this embodiment, current drivability can be further enhanced as compared to that of the typical semiconductor device described with reference to FIG. 1. When the buried regions 111 include silicon oxide, for example, IDSAT of PMOS can be enhanced by about 31 percent and that of NMOS can be enhanced by about 15 percent as compared to the typical device of FIGS 1A and 1B. The buried regions 111 may not be provided in NMOS and may be provided only in PMOS. In this case, current mobility of not only PMOS but also NMOS may be further enhanced (e.g., to the level of the NMOS of the first embodiment of FIGS. 2A to 2C). Moreover, when the buried regions 119 include an insulating layer, parasitic capacitance induced to the gate electrode 120 may be reduced. Thus, operating speed of the semiconductor device can be further enhanced.

Figure 5:
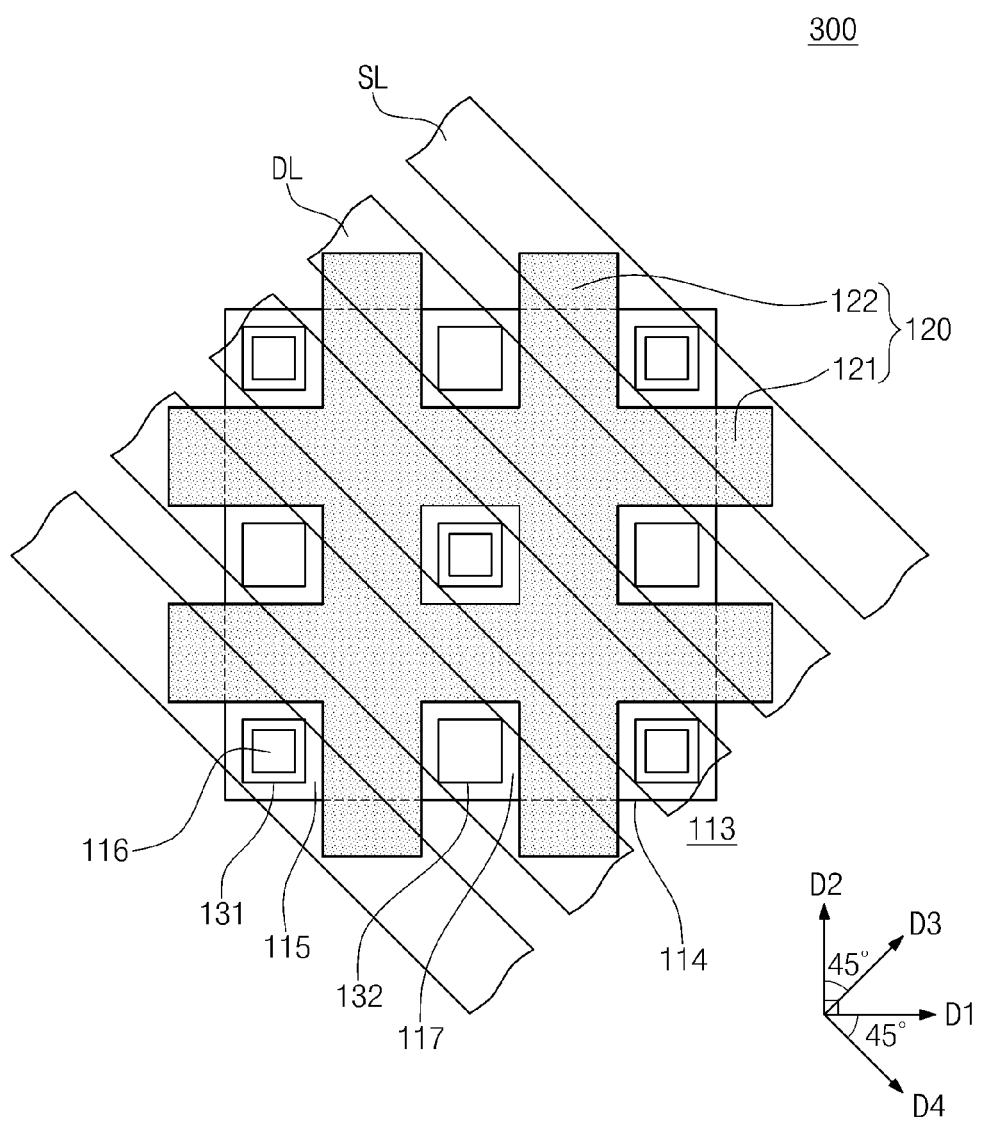
FIG. 5 illustrates a semiconductor device according to another embodiment of the inventive concept.

FIG. 5 illustrates a semiconductor device 300 according to another embodiment of the inventive concept. In FIG. 5, portions different from FIGS. 2A to 2C and FIG. 3 will be described to avoid duplicate explanation.

Referring to FIG. 5, first portions 121 and second portions 122 of the gate electrode 120 may be disposed in a different direction than those of the semiconductor device 200 described with reference to FIGS. 4A to 4C. The first portions 121 extend in the first direction D1. The second portions 122 may extend in the second direction D2. In other words, it will be understood that the gate electrode 120 is disposed to rotate 45 degrees clockwise. Thus, source regions 115 and drain regions 117 may be alternately arranged in the first direction D1 and the second direction D2.

According to this embodiment, a channel is in the first and second directions D1 and D2, i.e., a <110> direction. A mesh-type gate electrode according to this embodiment can enhance current drivability as compared to the typical semiconductor device described with reference to FIG. 1. For example, IDSAT of PMOS can be enhanced by about 19 percent and that of NMOS can be enhanced by about 18 percent.

Figure 6:
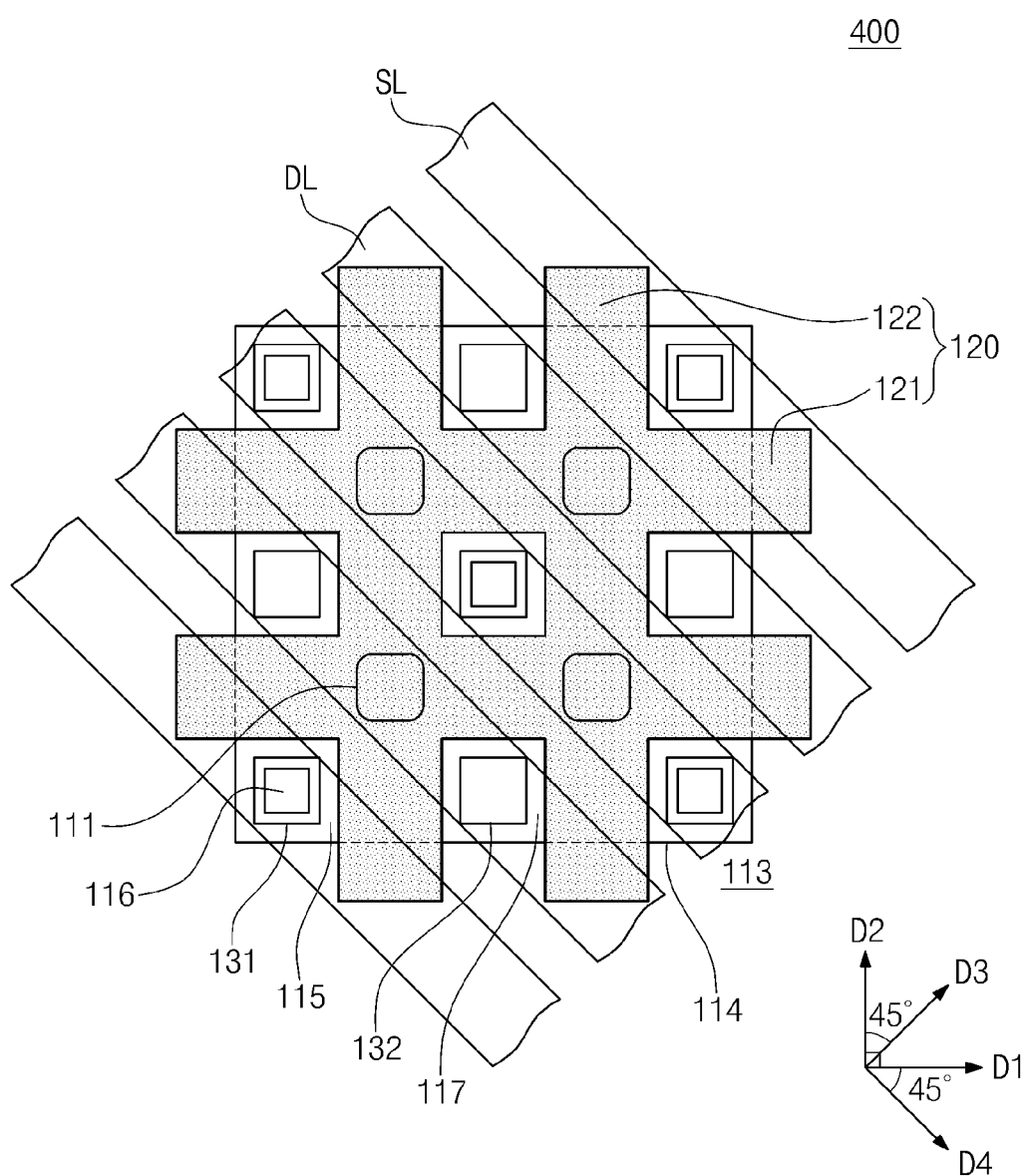
FIG. 6 illustrates a semiconductor device according to another embodiment of the inventive concept.

FIG. 6 illustrates a semiconductor device 400 according to another embodiment of the inventive concept. In FIG. 6, sections different from FIG. 5 will be extensively explained to avoid duplicate explanation.

Referring to FIG. 6, the semiconductor device 400 includes buried regions 111 explained with reference to FIGS. 4A to 4C. The buried regions 111 are provided in a substrate 110, in an overlap region of first portions 121 and second portions 122. The buried regions 111 induce compressive stress in channel regions 117.

According to this embodiment, current drivability can be enhanced as compared to the typical semiconductor device described with reference to FIG. 1. When the buried regions 111 include silicon oxide, for example, IDSAT of PMOS can be enhanced by about 16 percent and that of NMOS can be enhanced by about 16 percent.

Moreover in the above-described embodiments, in case of NMOS, a buried material may include silicon carbide. The silicon carbide may induce tensile stress in a silicon substrate 110. Thus, IDSAT of NMOS can be further enhanced.

Figure 7:
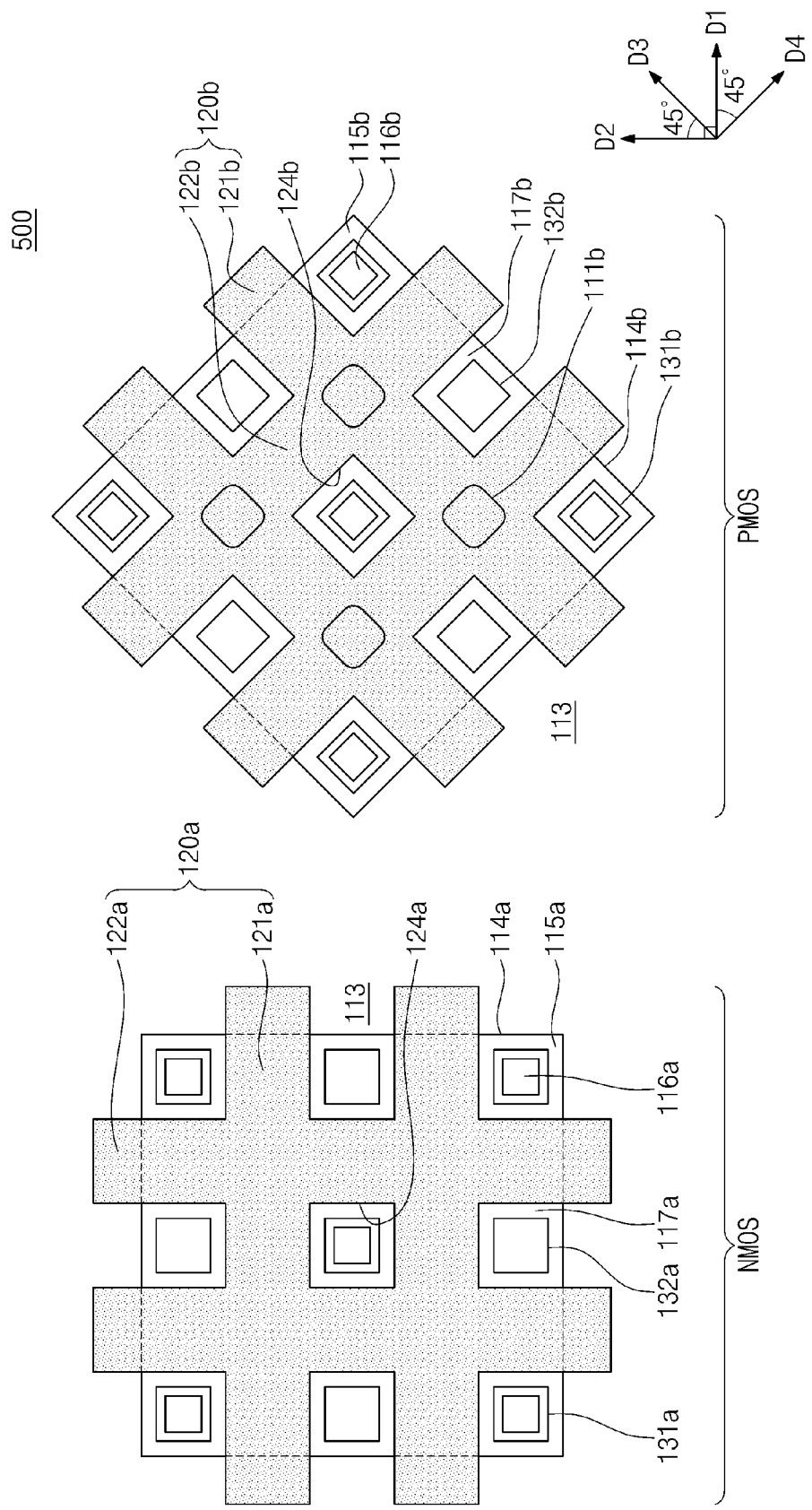
FIG. 7 illustrates a semiconductor device according to another embodiment of the inventive concept.

FIG. 7 illustrates a semiconductor device 500 according to another embodiment of the inventive concept. In FIG. 7, portions different from the foregoing embodiments will be described to avoid duplicate explanation.

Referring to FIG. 7, the semiconductor device 500 may include a PMOS region and an NMOS region. The PMOS region may have a transistor structure explained with reference to FIG. 5, and the NMOS region may have a transistor structure explained with reference to FIGS. 4A to 4C.

More specifically, the semiconductor device 500 may include a silicon substrate 110, a PMOS transistor in the PMOS region, an NMOS transistor in the NMOS region, and buried regions 111 disposed in the silicon substrate of the PMOS region. The silicon substrate 110 may include the PMOS region and the NMOS region. The NMOS transistor includes a mesh-type first gate electrode 120a having first portions 121a extending in the first direction D1 and second portions 122a extending in the second direction D2 orthogonal to the first direction D1. The mesh-type first gate electrode 120a has a plurality of first openings 124a. In addition, the NMOS transistor includes N-type source and drain regions 115a and 117a provided in the silicon substrate exposed by the first openings 124a. The PMOS transistor includes a mesh-type second gate electrode 120b having third portions 121b extending the third direction D3 that is 45 degrees from the first direction D1 and fourth portions 122b extending in the fourth direction D4 orthogonal to the third direction D3. The mesh-type second gate electrode 120b has a plurality of second openings 124b. In addition, the PMOS transistor includes N-type source and drain regions 115b and 117b provide in the silicon substrate exposed by the second openings 124b. The second buried regions 111b are disposed in the silicon substrate of an overlap region of the third portions 121b and the fourth portions 122b in the PMOS region. A buried material filing the second buried regions 111b may include silicon oxide, germanium or silicon-germanium.

In this embodiment, a channel of the PMOS transistor is in a <100> direction and undergoes compressive stress caused by the second buried regions 111b. A channel of the NMOS transistor is in a <110> direction and does not undergo compressive stress caused by the second buried regions 111b. According to this embodiment, current drivability can be enhanced as compared to the typical semiconductor device described with reference to FIG. 1. When a buried material includes silicon oxide, for example, IDSAT of PMOS can be enhanced by about 31 percent and that of NMOS can be enhanced by about 18 present.

Figure 8:
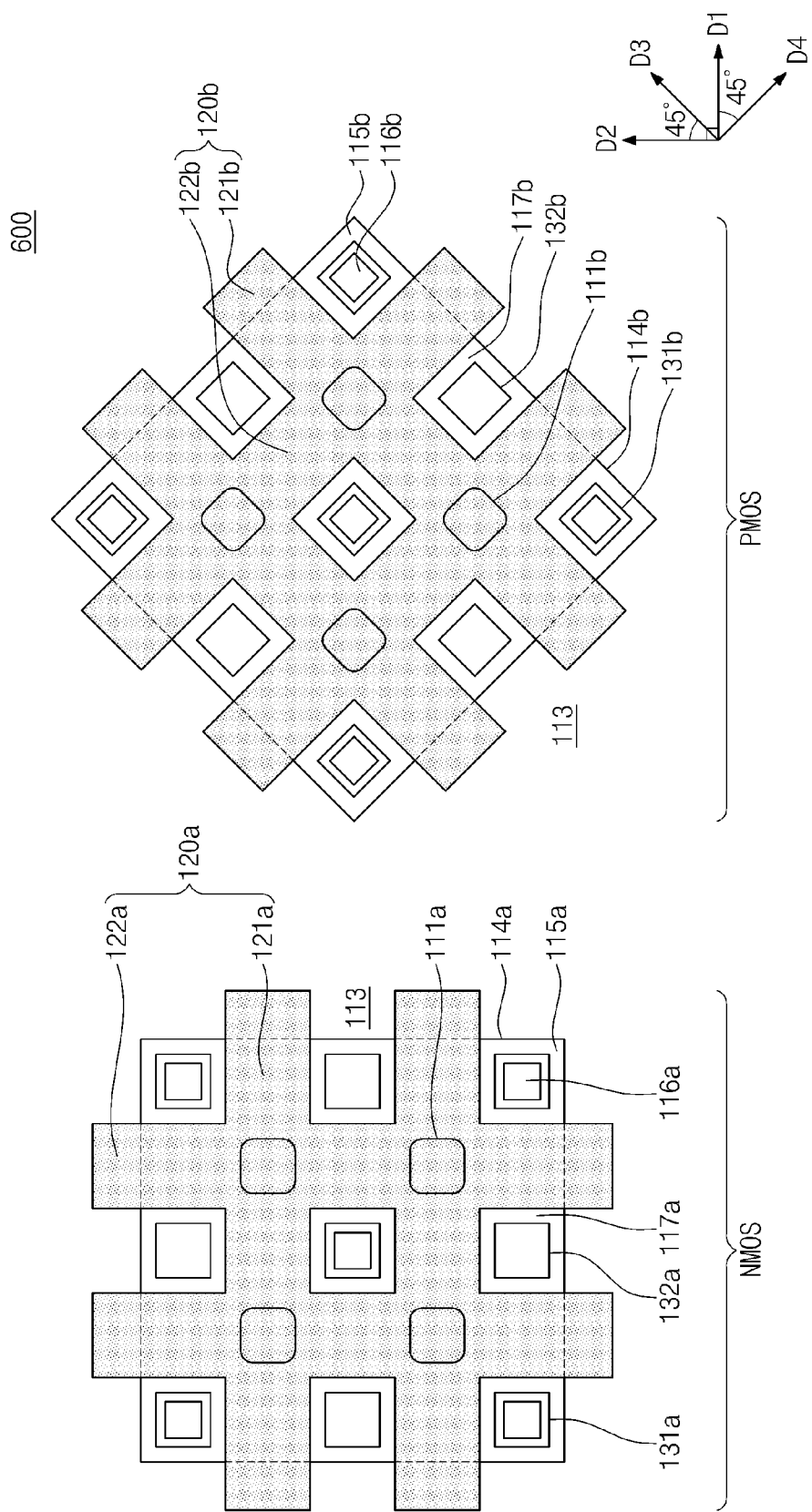
FIG. 8 illustrates a semiconductor device according to another embodiment of the inventive concept.

FIG. 8 illustrates a semiconductor device 600 according to another embodiment of the inventive concept. In FIG. 8, portions different from the foregoing embodiments will be described to avoid duplicate explanation.

Referring to FIG. 8, the semiconductor device 600 may include a PMOS region and an NMOS region. The PMOS region may have a transistor structure explained with reference to FIG. 6, and the NMOS region may have a transistor structure explained with reference to FIGS. 4A to 4C. First buried regions 111a may be further provided in the NMOS region. The first buried regions 111a in the NMOS regions may be filled with silicon carbide. Second buried regions 111b in the PMOS transistor may be filled with silicon oxide, germanium or silicon-germanium. Thus, the first buried regions 111a may induce tensile stress in NMOS, and the second buried regions 111b may induce compressive stress in PMOS.

According to this embodiment, current drivability of both NMOS and PMOS can be further enhanced.

Figure 9:
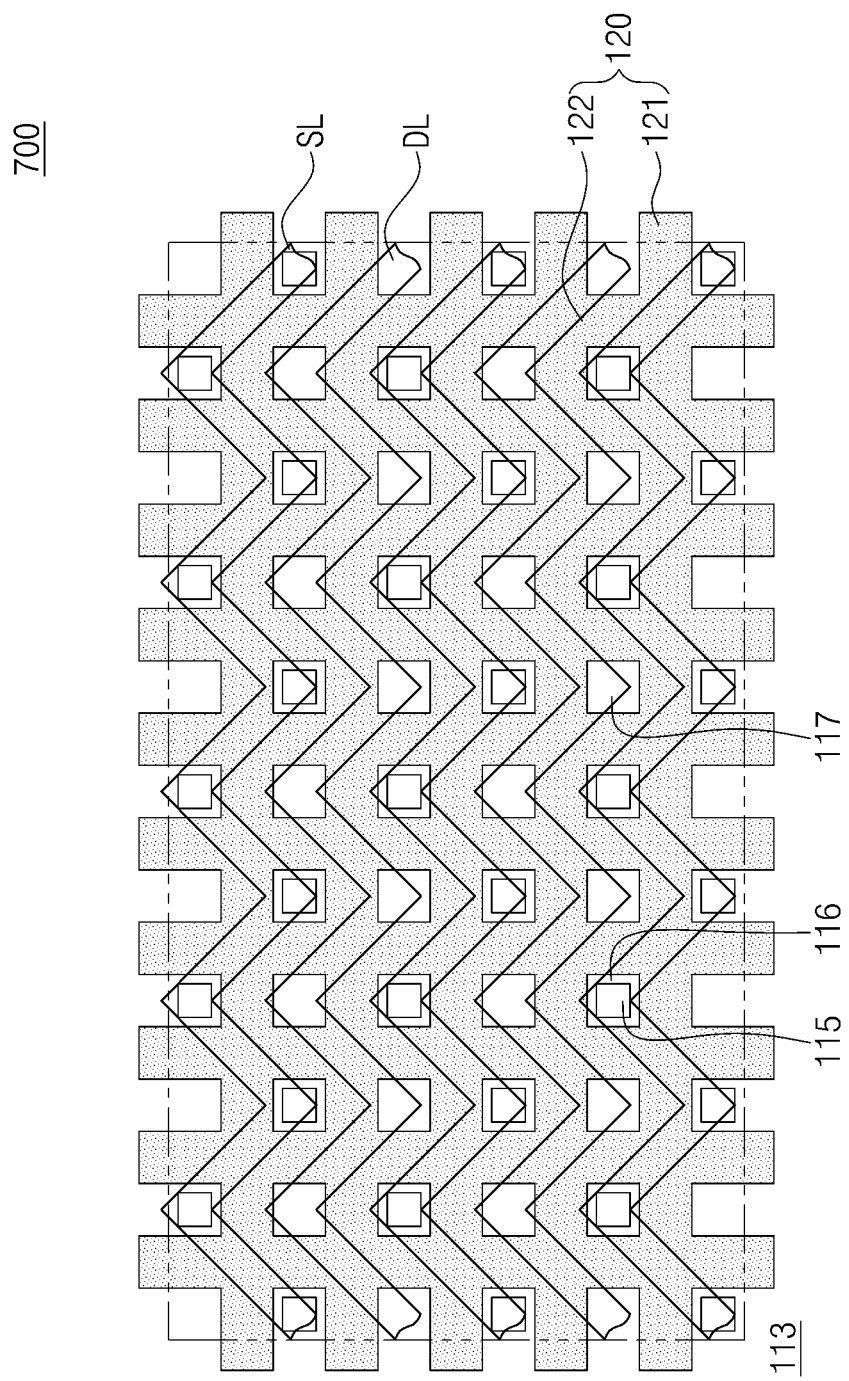
FIG. 9 illustrates a semiconductor device according to another embodiment of the inventive concept.

FIG. 9 illustrates a semiconductor device 700 according to another embodiment of the inventive concept. In FIG. 9, sections different from the foregoing embodiments will be extensively explained to avoid duplicate explanation.

Referring to FIG. 9, source regions 115 and drain regions 117 may have a rectangular shape. A source interconnection SL and a drain interconnection DL may be provided in a zigzag and may extend in a certain direction. The certain direction may be an extending direction of the first portions 121 or the second portions 122 of a gate (in the figure, the extending direction of the first portions 121 is shown but the certain direction is not limited thereto). In addition, although it is shown in the figure that the source interconnection SL and the drain interconnection DL extend in an elongation direction of rectangle, their extending direction is not limited thereto.

According to this embodiment, a contact area increases and thus a contact resistance can be reduced. Moreover, source interconnections SL and drain interconnection DL may increase in width to reduce resistance of the source interconnection SL and the drain interconnection DL.

Semiconductor devices according to the foregoing embodiments have superior current drivability. For this reason, a size of the semiconductor device can be effectively reduced. The semiconductor devices described herein may be embodied, for example, mobile applications such as a power management integrated circuit (PMIC) requiring low power consumption, such as, an application processor, a communication processor, and battery charging circuitry.

Figure 10A:
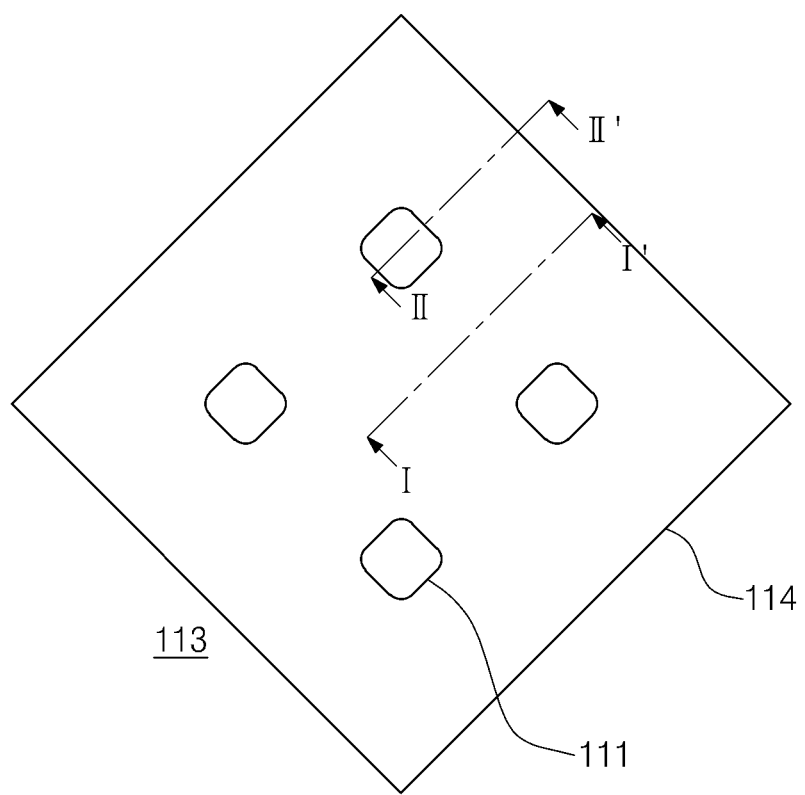
FIGS. 10A and 11A are top plan views illustrating a fabricating process of a semiconductor device according to another embodiment of the inventive concept.
Figure 10B:
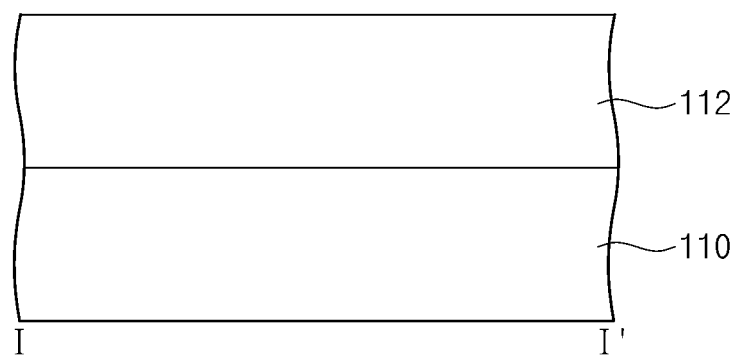
FIGS. 10B and 11B are cross-sectional views taken along the lines I-I' in FIGS. 10A and 11A, respectively.
Figure 10C:
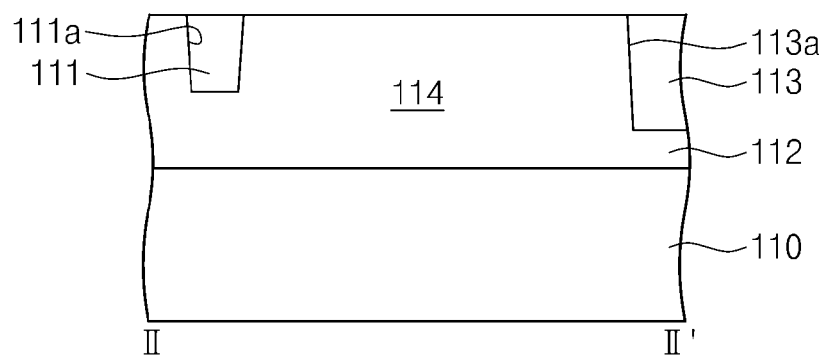
FIGS. 10C and 11C are cross-sectional views taken along the lines II-II' in FIGS. 10A and 11A, respectively.
Figure 11A:
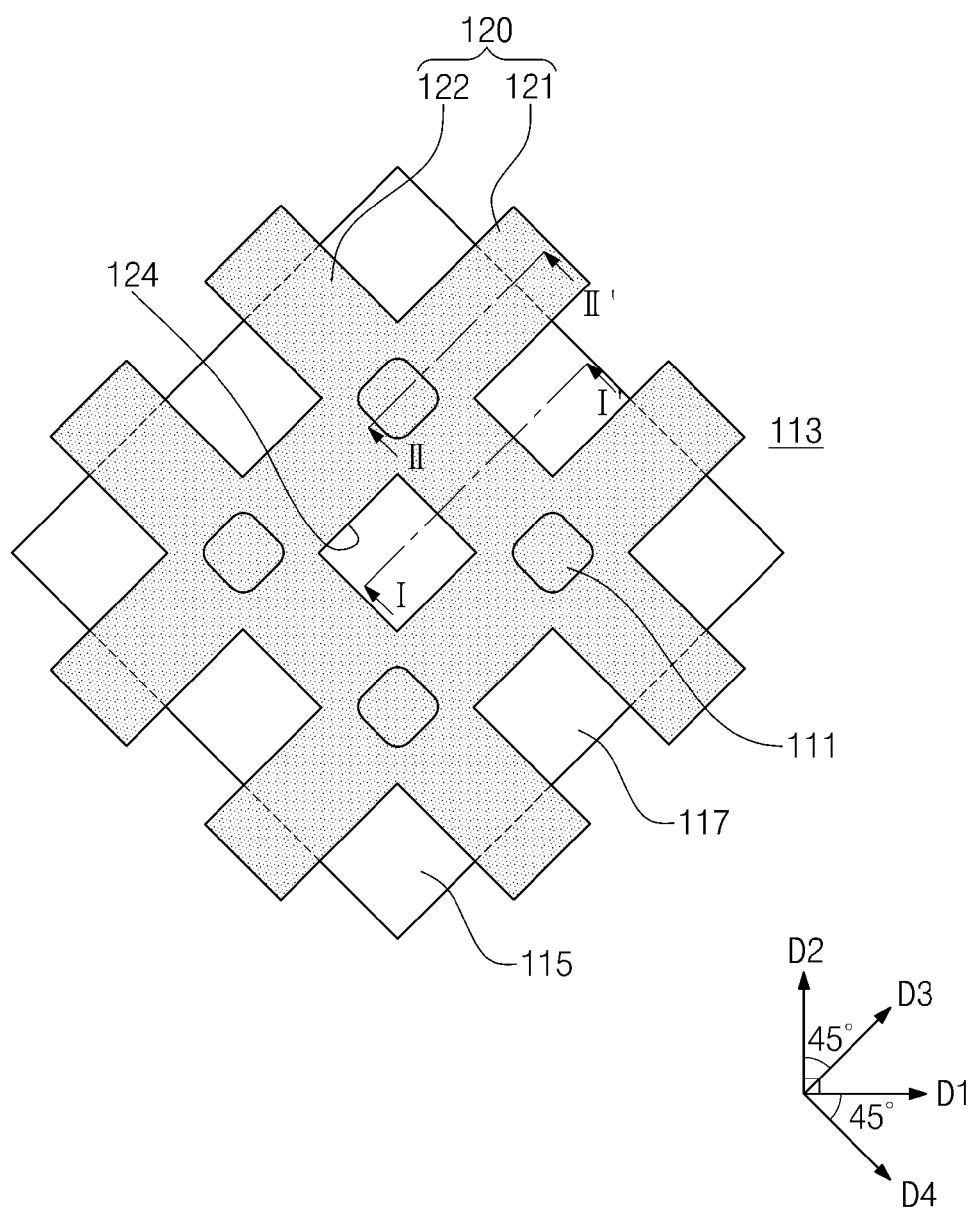
Figure 11B:
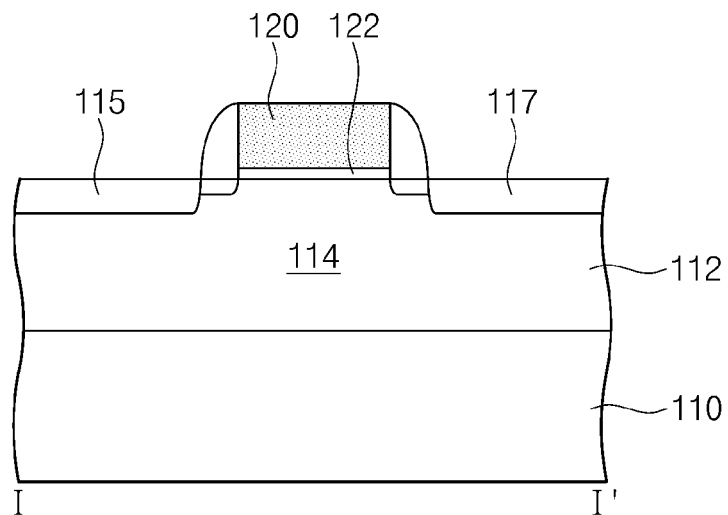

FIGS. 10A and 11A are top plan views illustrating a fabricating process of a semiconductor device 200 according to another embodiment of the inventive concept. FIGS. 10B and 11B are cross-sectional views taken along the lines I-I' in FIGS. 10A and 11A, respectively and FIGS. 10C and 1C are cross-sectional views taken along the lines II-II' in FIGS. 10A and 11A, respectively.

Referring to FIGS. 10A to 10C, a silicon substrate 110 is provided. The silicon substrate 110 has a top surface that is in a (100) direction. A <100> direction and a <110> direction are parallel to the top surface of the silicon substrate 110.

A well region 112 of first conductivity type may be formed in the silicon substrate 110. The first conductivity type may be N-type or P-type. For NMOS, the first conductivity type may be P-type. For PMOS, the first conductivity type may be N-type. A device isolation insulating layer 113 may be formed in the well region 112 to define an active region 114. The device isolation insulating layer 113 may surround the active region 114. Forming the device isolation insulating layer 113 may include forming a first trench 113a in the silicon substrate 110, filling the first trench 113a with a first insulating layer, and planarizing the first insulating layer to expose the silicon substrate 110. The first insulating layer may include silicon oxide.

Additionally, buried regions 111 may be formed in the active region 114. Forming the buried regions 111 may include forming second trenches 111a, filling the second trenches 111a with a buried material to induce compressive stress in the silicon substrate 110, and planarizing the buried material to expose the silicon substrate 110. The buried material may include, for example, silicon oxide or silicon germanium. Depth of the second trenches 111a may be equal to or smaller than that of the first trenches 113a. The second trenches 111a may be formed to be spaced apart from each other in the form of islands.

In an exemplary embodiment, the buried material may include silicon oxide. A device isolation insulating layer 113 and buried regions 111 may be simultaneously formed by filling first trenches 113a and second trenches 111a with a first insulating layer and planarizing the first insulating layer. The planarization may be done by means of, for example, a chemical mechanical polishing (CMP) process. A CMP process for the device isolation insulating layer 113 without buried regions 111 may result in dishing within the active region 114. A pressed-out material of the buried regions 111 may prevent the dishing. In particular, the dishing may be more effectively prevented when the active region 114 is wide.

In another exemplary embodiment, the buried material may include silicon germanium. In this case, buried regions 111 may be formed by means of a different process than the device isolation insulating layer 113. The process may include forming the second trench 111a and filling the second trench 111a with silicon germanium. The second trench 111a shown in FIG. 10C may be formed and expose a side surfaces of the silicon substrate 110 in active region 114. In certain embodiments, the a side surface(s) of the silicon substrate may have a {111} surface. The silicon germanium may be epitaxially grown on the {111} surface to fill the second trench 111a and protrude upwardly from the surface of the silicon substrate 110. The silicon germanium protruding above the top surface of the silicon substrate 110 may be planarized to be removed. Thus, the buried regions 111 are formed. Afterwards, the device isolation insulating layer 113 may be formed by forming the first trench 113a, filling the first trench 113a with silicon oxide, and planarizing the silicon oxide. Alternatively, the order of forming the buried regions 111 and the device isolation insulating layer 113 may be changed.

Figure 11C:
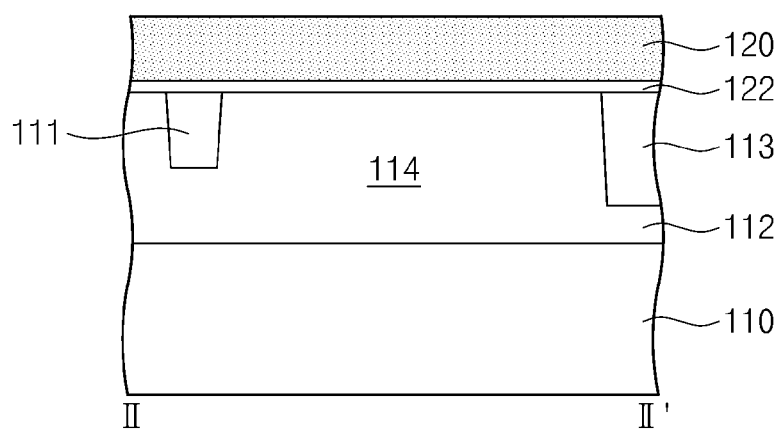

Referring to FIGS. 11A to 11C, a gate electrode 120 may be formed on the silicon substrate 110. The gate electrode 120 has first portions 121 extending in the third direction D3 and second portions 122 extending in the fourth direction D4. Thus, the gate electrode 120 may be a mesh-type (or grid-type) electrode having a plurality of openings 124. The openings 124 may be formed to expose the silicon substrate 110. The gate electrode 120 may be formed of, for example, polysilicon of the second conductivity type. A gate insulating layer 122 may be provided between the silicon substrate 110 and the gate electrode 120. The gate insulating layer 122 may be formed of, for example, silicon oxide. An insulating spacer may be further provided on the sidewall of the gate electrode 120.

Source regions 115 and drain regions 116 are formed in the silicon substrate 110 exposed by the openings 124. The source regions 115 and the drain regions 117 may be formed by introducing impurities of the second conductivity type into the silicon substrate 110 using the gate electrode 120 as a mask. Thus, the source regions 115 and the drain regions 117 may be alternately provided in the third direction D3 and the fourth direction D4. An upper portion of the silicon substrate 110 covered with the gate electrode 120 may function as a channel region 118.

Returning to FIGS. 4A to 4C, an interlayer dielectric 130 may be formed on the silicon substrate 110. The interlayer dielectric 130 may include silicon oxide. By patterning the interlayer dielectric layer 130, first contact holes 135 may be formed to expose the source regions 115. Ground contact regions 116 may be formed by introducing impurities of the first conductivity type into the source regions 115 exposed to the first contact holes 135. The ground contact regions 116 may be surrounded by the source regions 115. By patterning the interlayer dielectric 130 using a photoresist (not shown) covering the first contact holes 135, second contact holes 136 may be formed to expose the drain regions 117. First contacts 131 and second contacts 132 may be formed in the first contact holes 135 and the second contact holes 136, respectively. The first and second contacts 131 and 132 may include titanium, titanium nitride, and/or tungsten.

Source interconnections SL and drain interconnections DL may be formed on the interlayer dielectric 130. The source interconnections SL may connect the source regions 115 arranged in the first direction D1. The source interconnections SL may be connected to the source regions 115 through the first contacts 131. The first contact 31 may be in contact with the ground contact regions 116. The source interconnections SL may extend in the first direction D1. The drain interconnections DL may connect the drain regions 117 arranged in the first direction D1. The drain interconnections DL may be connected to the drain regions 117 through the second contacts 132. The drain interconnections DL may extend in the first direction D1. The source interconnections SL and the drain interconnections DL may be alternately arranged in the second direction D2.

Semiconductor devices 100, 300, 400, 500, 600, and 700 according to other embodiments may be formed in similar methods to the above method.

Figure 12:
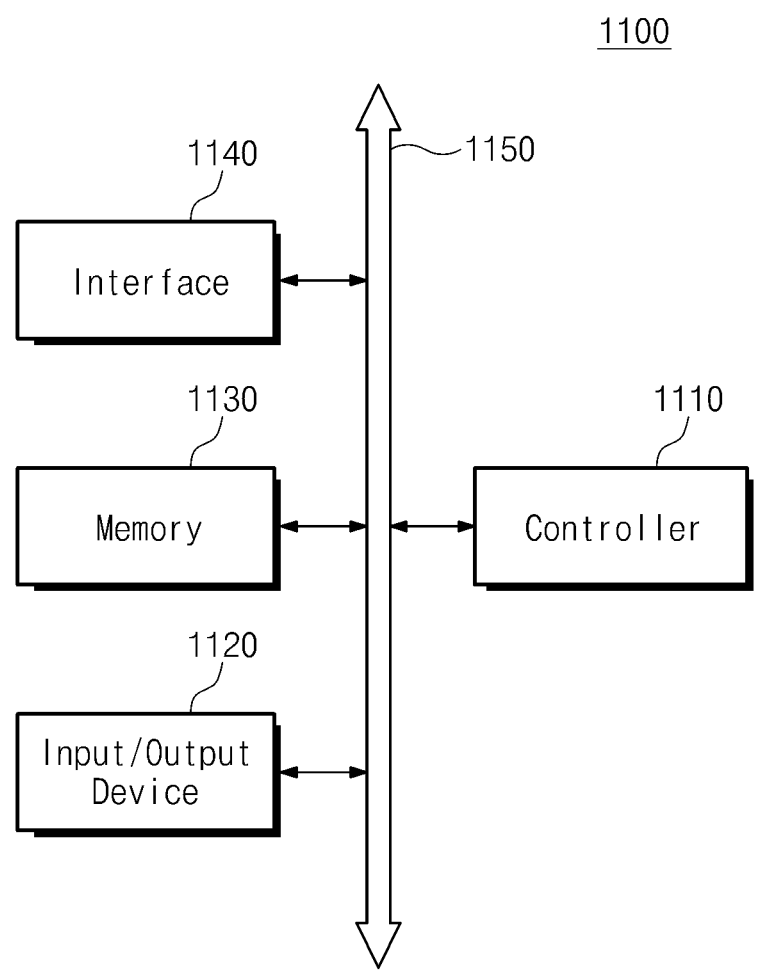
FIGS. 12 and 13 illustrate electronic devices according to embodiments of the inventive concept.
Figure 13:
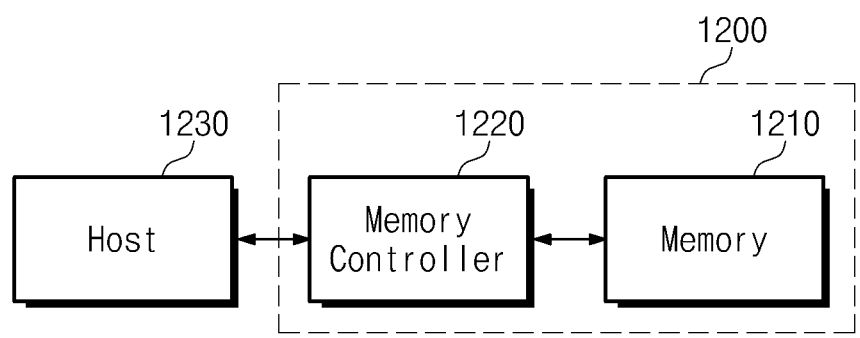

FIGS. 12 and 13 illustrate electronic devices including a semiconductor device according to embodiments of the inventive concept.

Referring to FIG. 12, an electronic device 1100 according to embodiments of the inventive concept may incorporate one or more of the semiconductor devices described herein and be one of a personal digital assistant (PDA), a laptop computer, a portable computer, a wet tablet, a wireless phone, a mobile phone, a digital music player, a wireless/wired electric device or a complex electronic device including at least two of the above. The electronic device 1100 may include a controller 1110, an input/output device (I/O device) 1120 such as a keypad, a keyboard, a display or TPS, a memory 1130, and an interface 1340, which may be connected to each other through a bus 1150. The controller 1110 may include, for example, at least one of a microprocessor, a digital signal processor, a microcontroller or the like. For example, the memory 1130 may be used to store a command executed by the controller 1110. The memory 1130 may also be used to store user data. The electronic device 1100 may use the wireless interface 1140 to transmit or receive data to or from a wireless communication network that communicates with a radio frequency (RF) signal. The interface 1140 may include, for example, an antenna, a wireless transceiver or the like. The controller 1110, the I/O device 1120, the memory 1130, and/or the interface 1140 may include semiconductor devices according to the above-described embodiments of the inventive concept.

The electronic device 1100 may be used to implement a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, and MMDS.

Referring to FIG. 13, semiconductor devices according to embodiments of described herein may be used to implement a memory system according to further embodiments. The memory system 1200 may include a memory 1210 configured to store mass data and a memory controller 1220. The memory controller 1220 controls the memory device 1410 to read or write stored data from or to the memory device 1210 in response to a read/write request of a host 1230. The memory controller 1220 may constitute an address mapping table for mapping an address provided from the host 1230 (e.g., a mobile device or a computer system) into a physical address of the memory device 1210. The memory 1210 and/or the memory controller 1220 may include semiconductor devices described herein.

Semiconductor devices disclosed in the above-described embodiments may be packaged as one of various types to be subsequently embedded. For example, semiconductor devices according to embodiments of the inventive concept may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

A package on which a semiconductor device according to embodiments of the inventive concept is mounted may further include a controller to control the semiconductor device and/or a logic element.

While the inventive concepts have been particularly shown and described with reference to exemplary embodiments thereof, it will be apparent to those of ordinary skill in the art that various changes in form and detail may be made therein without departing from the spirit and scope of the inventive concepts as defined by the following claims.

What is claimed is:

1. A semiconductor device comprising:
   a silicon substrate of a first conductivity type;
   a mesh-type gate electrode on the silicon substrate, including first portions extending in a first direction and second portions extending in a second direction orthogonal to the first direction, and having a plurality of openings;
   buried regions provided in a form of islands in the silicon substrate under corresponding intersection regions of the first portions and the second portions; and
   source regions and drain regions of a second conductivity type arranged in the silicon substrate at locations exposed by the openings, the source regions and drain regions being alternately arranged in the first direction and alternately arranged in the second direction,
   wherein the first direction is a <100> silicon crystal direction of the silicon substrate.

2. The semiconductor as set forth in claim 1, wherein the buried regions comprise a buried material in openings formed in the silicon substrate under the intersection regions.

3. The semiconductor device as set forth in claim 1, further comprising:
   a gate insulating layer between the substrate and the gate electrode,
   wherein the first conductivity type is N-type, and the second conductivity type is P-type.

4. The semiconductor device as set forth in claim 1, further comprising:

source interconnection lines extending in a third direction that is at an angle of 45 degrees from the first direction, the source interconnection lines connecting corresponding subsets of the source regions; and drain interconnection lines extending in the third direction and connecting corresponding subsets of the drain regions, wherein the source interconnection lines and the drain interconnection lines are alternately arranged in a fourth direction orthogonal to the third direction.

5. The semiconductor device as set forth in claim 1, wherein the source regions and the drain regions are located within an active region defined in the semiconductor substrate, the active region comprising a first side and a second side located on an opposite side of the active region than the first side in either the first direction or the second direction, and wherein the semiconductor device further comprises:

source interconnection lines having a zigzag formation and extending from the first side of the active region to the second side of the active region and connecting the source regions; and drain interconnection lines having a zigzag formation and extending from the first side of the active region to the second side of the active region and connecting the drain regions.

6. The semiconductor device as set forth in claim 1, wherein a top surface of the semiconductor substrate is a (100) surface.

7. The semiconductor device as set forth in claim 1, wherein, with respect to a top down view, each of the buried regions is located within a rectangle whose corners correspond to two of the source regions and two of the drain regions, wherein each of the two source regions are direct neighbors to each of the two drain regions.

8. The semiconductor device as set forth in claim 1, wherein, with respect to a top down view, each of the buried regions is located at an intersection of a first line extending between two of the source regions and a second line extending between two of the drain regions, wherein each of the two source regions are direct neighbors to each of the two drain regions.

9. The semiconductor device as set forth in claim 1, wherein each of the buried regions, with respect to a top down view and an outer perimeter of the corresponding buried region, are completely filled with a material.

10. The semiconductor as set forth in claim 2, wherein the buried material comprises at least one of silicon oxide, germanium and silicon germanium.

11. A semiconductor device comprising:

a silicon substrate of a first conductivity type;

a mesh-type gate electrode on the silicon substrate, including first portions extending in a first direction and second portions extending in a second direction orthogonal to the first direction, and having a plurality of openings;

source regions and drain regions of a second conductivity type in the silicon substrate at locations under the openings, the source regions and drain regions being alternately arranged in the first direction and alternately arranged in the second direction; and embedded regions embedded in the silicon substrate located under intersections of the first portions and the second portions.

12. The semiconductor device as set forth in claim 11, wherein the embedded regions induce compressive stress in channel regions between the source regions and the drain regions.

13. The semiconductor device as set forth in claim 11, wherein the embedded regions induce tensile stress in channel regions between the source regions and the drain regions.

14. The semiconductor device as set forth in claim 11, wherein the first direction is a <100> silicon crystal direction.

15. The semiconductor device as set forth in claim 12, wherein the embedded regions include at least one of silicon oxide, germanium and silicon germanium.

16. The semiconductor device as set forth in claim 12, further comprising:

a gate insulating layer between the silicon substrate and the gate electrode, wherein the first conductivity type is N-type and the second conductivity type is P-type.

17. The semiconductor device as set forth in claim 13, wherein the buried regions include silicon carbide.

18. The semiconductor device as set forth in claim 13, further comprising:

a gate insulating layer between the silicon substrate and the gate electrode, wherein the first conductivity type is P-type and the second conductivity type is N-type.

19. A semiconductor device comprising:

a silicon substrate including a PMOS region and an NMOS region;

a PMOS transistor in the PMOS region, including a mesh-type first gate electrode including first portions extending in a first direction and second portions extending in a second direction crossing the first direction and having a plurality of first openings and P-type source and drain regions provided at locations under the first openings;

an NMOS transistor in the NMOS region, including a mesh-type second gate electrode including third portions extending in a third direction that is at an angle of 45 degrees from the first direction and fourth portions extending in a fourth direction orthogonal to the third direction and having a plurality of second openings and N-type source and drain regions provided at locations under the second openings; and first embedded regions disposed in the silicon substrate under respective intersection regions of the first portions and the second portions.

20. The semiconductor device as set forth in claim 19, wherein the first direction is a <100> silicon crystal direction of the silicon substrate.

21. The semiconductor device as set forth in claim 19, wherein the first embedded regions induce compressive stress in channel regions between the source regions and the drain regions.

22. The semiconductor device as set forth in claim 19, further comprising:

second embedded regions disposed in the silicon substrate under respective intersection regions of the third portions and the fourth portions, the second embedded regions inducing tensile stress in channel regions between the source regions and the drain regions.

23. A semiconductor device comprising:

a crystalline semiconductor substrate;

a device isolation insulator embedded within the semiconductor substrate and defining a first active region;

a PMOS transistor comprising:

a first gate electrode having a mesh structure formed over the first active region; and a plurality of first source regions and first drain regions formed in the first active region at locations under openings of the mesh structure of the first gate electrode, wherein a plurality of first channel regions are formed in the first active region at locations between neighboring first source regions and first drain regions, at least some of the first channel regions having a channel length extending in a first direction, and wherein the first direction is a <100> crystal direction of the crystalline semiconductor substrate; and a plurality of depressions formed in the semiconductor substrate at locations under intersection portions of the mesh structure of the first gate electrode, the plurality of depressions including a material formed therein.

24. The semiconductor device of claim 23, wherein ones of the first source regions have plural neighboring first drain regions with plural corresponding first channel regions disposed therebetween under the mesh structure of the first gate electrode.

25. The semiconductor device of claim 23, wherein the material is an insulator.

26. The semiconductor device of claim 23, wherein the material is a semiconductor.

27. The semiconductor device of claim 23, wherein the crystalline semiconductor substrate is a crystalline silicon substrate.

28. The semiconductor device of claim 23,
wherein the device isolation insulator defines a second active region; and
wherein the semiconductor device further comprises:
an NMOS transistor comprising:
a second gate electrode having a mesh structure formed over the second active region; and
a plurality of second source regions and second drain regions formed in the second active region at locations under depressions of the mesh structure of the second gate electrode,
wherein a plurality of second channel regions are formed in the second active region at locations at locations between neighboring second source regions and second drain regions, at least some of the channel regions having a channel length extending in a second direction.

29. The semiconductor device of claim 24, wherein some of the corresponding first channel regions have a channel length extending in the first direction and others of the corresponding first channel regions have a channel length extending in a direction perpendicular to the first direction.

30. The semiconductor device of claim 26, wherein the material is one of germanium and silicon-germanium.

31. The semiconductor device of claim 28, wherein the second direction is at an angle of 45 degrees from the first direction.

32. The semiconductor device of claim 28, wherein the first direction and the second direction are the same.

33. The semiconductor device of claim 28, further comprising:
a plurality of depressions formed in the semiconductor substrate at locations under intersection portions of the mesh structure of the first gate electrode, the plurality of depressions including a material formed therein,
wherein depressions are not formed in the semiconductor substrate at locations under intersection portions of the mesh structure of the second gate.

34. The semiconductor device of claim 28, further comprising:
a plurality of first depressions formed in the semiconductor substrate at locations under intersection portions of the mesh structure of the first gate electrode, the plurality of first depressions including a first material formed therein, and
a plurality of second depressions formed in the semiconductor substrate at locations under intersection portions of the mesh structure of the second gate electrode, the plurality of second depressions including a second material formed therein, the second material being different than the first material.

35. The semiconductor device of claim 34, wherein the first material formed in the first depressions induces a compressive stress in the first channels and the second material formed in the second depressions induces a tensile stress in the second channels.

* * * * *